United States Patent [19]

Bhavsar

[11] Patent Number: 4,669,061
[45] Date of Patent: May 26, 1987

[54] SCANNABLE FLIP-FLOP

[75] Inventor: Dilip K. Bhavsar, Shrewsbury, Mass.

[73] Assignee: Digital Equipment Corporation, Maynard, Mass.

[21] Appl. No.: 684,357

[22] Filed: Dec. 21, 1984

[51] Int. Cl.$^4$ .............................................. G11C 11/40
[52] U.S. Cl. .................................... 365/154; 365/201; 371/25; 307/465
[58] Field of Search .......................... 365/154, 78, 201; 307/272 A, 276, 465, 480, 481; 371/25

[56] References Cited

U.S. PATENT DOCUMENTS 4,390,970  6/1983  Kay ...................................... 307/481
4,540,903  9/1985  Cook et al. ...................... 307/272 A

OTHER PUBLICATIONS

King, "Dynamic LSSD Latch", IBM TDB, Dec. 1979, vol. 22, No. 7, p. 2618.
Moser, "LSSD Test Architecture", IBM Tech. Disc. Bull., vol. 24, No. 3, Aug. 1981, pp. 1666-1667.
Lo, "LSSD Implimented with DCVS Logic", IBM Tech. Disc. Bull., vol. 26, No. 11, Apr. 1984, pp. 5805-5810.

Primary Examiner—Terrell W. Fears
Attorney, Agent, or Firm—Cesari and McKenna

[57] ABSTRACT

A digital circuit operable in a normal mode and in a test mode including memory elements which each operates as a static latch during the normal mode and operates as a dynamic master-slave flip-flop during the test mode. The digital circuit also includes combinational logic having a plurality of outputs, means operable in the normal mode to connect a combinational logic output to each of the inputs of the memory elements, and means operable in the test mode to connect outputs of memory elements to inputs of other memory elements so as to form a shift register to facilitate testing of complex digital circuits.

8 Claims, 3 Drawing Figures

SCANNABLE FLIP-FLOP

FIELD OF THE INVENTION

The invention relates to a circuit for a flip-flop that is particularly useful in integrated circuits that are designed to be testable.

BACKGROUND OF THE INVENTION

Testing Complex Integrated Circuits

As integrated circuits become more complex, they become more difficult to test. A complex digital circuit is typically sequential, that is, it consists of combinational logic, memory elements, some primary inputs, and some outputs through which it communicates with the external world. Testing an integrated circuit involves applying a test vector at the primary inputs and observing its responses at the primary outputs. To fully test an integrated circuit, a set of test vectors must be generated such that possible faults on all the circuit's internal nodes can be detected by observing responses. This is made difficult by the inadequacy of access provided by the limited number of externally controllable primary inputs and externally observable primary outputs. Further, it is made even more difficult by the presence of internal memory elements and feedback in the logic.

To make the testing of a complex integrated circuit manageable, the circuit can be designed to provide for access to all or a selected set of the memory elements of the circuit by making the memory elements "scannable". In a scannable memory element, a second "scan" input to each memory element is provided and is connected to the output of another memory element, so that the memory elements form a shift register.

The scan feature can be used in testing a circuit as follows. The memory elements are first set to predetermined states by shifting a test vector into the shift register formed by enabling the test inputs to the memory elements. The circuit is then operated for one or more clock cycles in its normal mode of operation. The resulting states of all of the memory elements are then read by again enabling the test inputs and shifting the result vector to an output terminal. While the result vector is being shifted out, another test vector can be shifted in, in preparation for another test.

Making internal memory elements scannable not only provides additional directly controllable and observable points within the circuit, but also converts the difficult problem of testing a sequential circuit to the easier problem of testing a combination circuit.

Scannable Memory Elements

Memory elements in an integrated circuit may consist of latches or master-slave flip-flops. A latch is a memory element whose output follows its input during the time its clock is asserted. A master-slave flip-flop consists of two latches connected in series and clocked in sequence (preferably by non-overlapping clock phases); thus, the output of a master-slave flip-flop is stable during the time its input is being latched. An integrated circuit may have either or both types of memory elements. These memory elements are clocked by two or more clock phases such that the output of a latch does not directly affect its own input, or produce critical signal races and hazards. For example, a latch output should feed the input of another latch, directly or through logic, only if the clocks driving the two latches are non-overlapping.

In a typical MOS implementation, a master-slave flip-flop can easily be made scannable by the addition of a switch connected to provide an alternative input. Use of latches instead of master-slave flip-flops in complex sequential integrated circuits is very common; however, it is more difficult to make latches scannable. In order to make a latch scannable in addition to the switch to provide an alternative input source, a whole slave latch must be added, along with associated clock and control lines to make it operate properly as a part of the scan shift register. In addition to requiring a lot of extra circuitry, such a scheme has the disadvantage that test vectors must be separately loaded for each phase-group of latches. This is because during testing each latch must act both as test data source for the combinational section that follows it, and as test response sink for the combinational section that feeds it.

As explained before, after serially loading a test vector, a clock must be applied to capture the response of the circuit into the latches. As soon as the phase clock to a latch group is applied to capture response data, test data stored by it for the succeeding combinational section is destroyed. Therefore, the responses in the latches of the first phase-group must be shifted out and the test data must be shifted in again before clocking the latches of the next phase-group. This slows down the testing process.

One way to reduce the amount of circuitry required is to add only a switch to provide an alternative input source on each latch and arrange them into a shift register by forming master-slave flip-flops by joining latches of different phase-groups. However, what is saved in transistors is lost in numerous lengthy interconnections, as the latches belonging to the same phase-group are typically located in clusters (for example, registers), and the latches belonging to different phase-groups are usually separated by a region of combinational logic.

To facilitate the testability of complex integrated circuits, it is desirable to provide scannable latches that can be chained in any order. It is also desirable that the entire logic of a multi-phase circuit be testable with single loads of test vectors. Furthermore, it is very desirable that provision of such capabilities be accomplished with minimal wiring and the fewest additional transistors.

SUMMARY OF THE INVENTION

According to the present invention, a digital circuit is operable in a normal operating mode and in a test mode during which test vectors are shifted into the circuit. The circuit includes memory elements each of which operates as a static latch during the normal mode and as a dynamic master-slave flip-flop during the test mode. Each memory element each includes, in series connection, between a normal input terminal and an output terminal of the memory element a normal input switch, a first inverter, a forward switch, and a second inverter. Each memory element also includes a feedback switch connected between the output terminal of the second inverter and the input terminal of the first inverter, and a test input switch connected between a test input terminal and the input terminal of the first inverter. The memory elements are connected into a shift register by connecting the output terminal of one memory element to the test input terminal of the next memory element in the shift register. The digital circuit also includes combinational logic having a plurality of output terminals, some of which are connected to normal input terminals of memory elements, and a plurality of input terminals, some of which are connected to output terminals of memory elements.

In the normal mode of operation the forward switch is on, the test input switch is off, and the normal input switch and the feedback switch are controlled by complementary clock signals. In the test mode of operation the feedback switch is off, the normal input switch is off, and the test input switch and the forward switch are operated by non-overlapping clock signals. In the test mode, the test input switch and the first inverter operate as a master latch, while the forward switch and the second inverter operate as a slave latch, these two latches together operating as a master-slave flip-flop. Thus, in the test mode, the memory elements operate as a shift register into which can be shifted a test vector.

BRIEF DESCRIPTION OF THE DRAWINGS

The invention is pointed out with particularity in the appended claims. The above and other advantages of the invention may be better understood by referring to the following detailed description in conjunction with the drawings in which:

DESCRIPTION OF AN ILLUSTRATIVE EMBODIMENT

Figure 1:
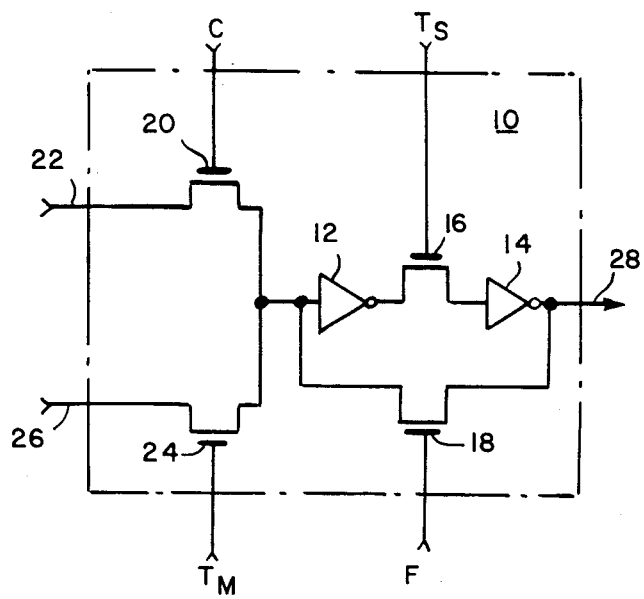
FIG. 1 is a circuit diagram of a scannable flip-flop according to the present invention.

FIG. 1 shows a scannable flip-flop 10 constructed in accordance with the present invention. In the flip-flop 10, the output of a first inverter 12 is connected to the input of a second inverter 14 by a forward switch 16. A feedback switch 18 connects the output of the second inverter 14 to the input of the first inverter 12. The input of the first inverter 12 is connected by a normal input switch 20 to a normal input node 22 and by a test input switch 24 to a test input node 26. The output of the second inverter 14 is connected to an output node 28.

The inverters 12 and 14 are implemented using conventional MOS techniques. The switches 16, 18, 20, and 24 are MOS transistors. The state of these switches (on or off) is controlled by signals applied to the gates of each of the respective transistors. Specifically, a signal $T_S$ controls forward switch 16, a signal F controls feedback switch 18, a signal C controls normal input switch 20; and signal $T_M$ controls test input switch 24. Alternative implementations of the switches are possible; for example, when using CMOS techniques each switch can be implemented by complementary MOS transistors connected in parallel and driven by complementary control signals.

The scannable flip-flop 10 can be operated as a static latch or as a dynamic master-slave flip-flop.

The operation of flip-flop 10 as a static latch is as follows. The signal $T_S$ is set to hold the forward switch 16 in the on state. A pulse on signal C closes the normal input switch 20 and thereby couples the signal at the normal input node 22 to the first inverter 12; in other words, signal C clocks data from the normal input node 22 into the latch. The signal F is the complement of signal C and therefore when the pulse on signal C ends the signal through the feedback switch 18 holds the latch in the state determined by the data clocked in by the signal C and makes the latch a static latch. Input to the flip-flop 10 can be alternatively be received from the test input node 26 through the test input switch 24; in this case, a pulse on the signal $T_M$ clocks data into the latch and the signal F is the complement of $T_M$.

When used as a master-slave flip-flop, one of the input switches 20 or 24 together with the inverter 12 form a master latch, and the switch 16 and the inverter 14 form a slave latch; when used as a master-slave flip-flop, the feedback through switch 18 is turned off. These are dynamic latches: the state of the master and slave latches is determined by the charge stored in the inherent gate capacitance at the input of the respective inverter. Although the duration for which dynamic latches will maintain their state is limited, the duration is generally sufficient for the test purposes described below as well as for many other purposes.

The operation of flip-flop 10 as a dynamic master-slave flip-flop is as follows. Signal F is set to hold feedback switch 18 off. Either of signals C or $T_M$, but not both, is used to clock data into the master latch. Signal $T_S$ clocks data into the slave latch. Thus, in typical master-slave operation, clock pulses alternate between the C or $T_M$ signals and the $T_S$ signal.

Figure 2:
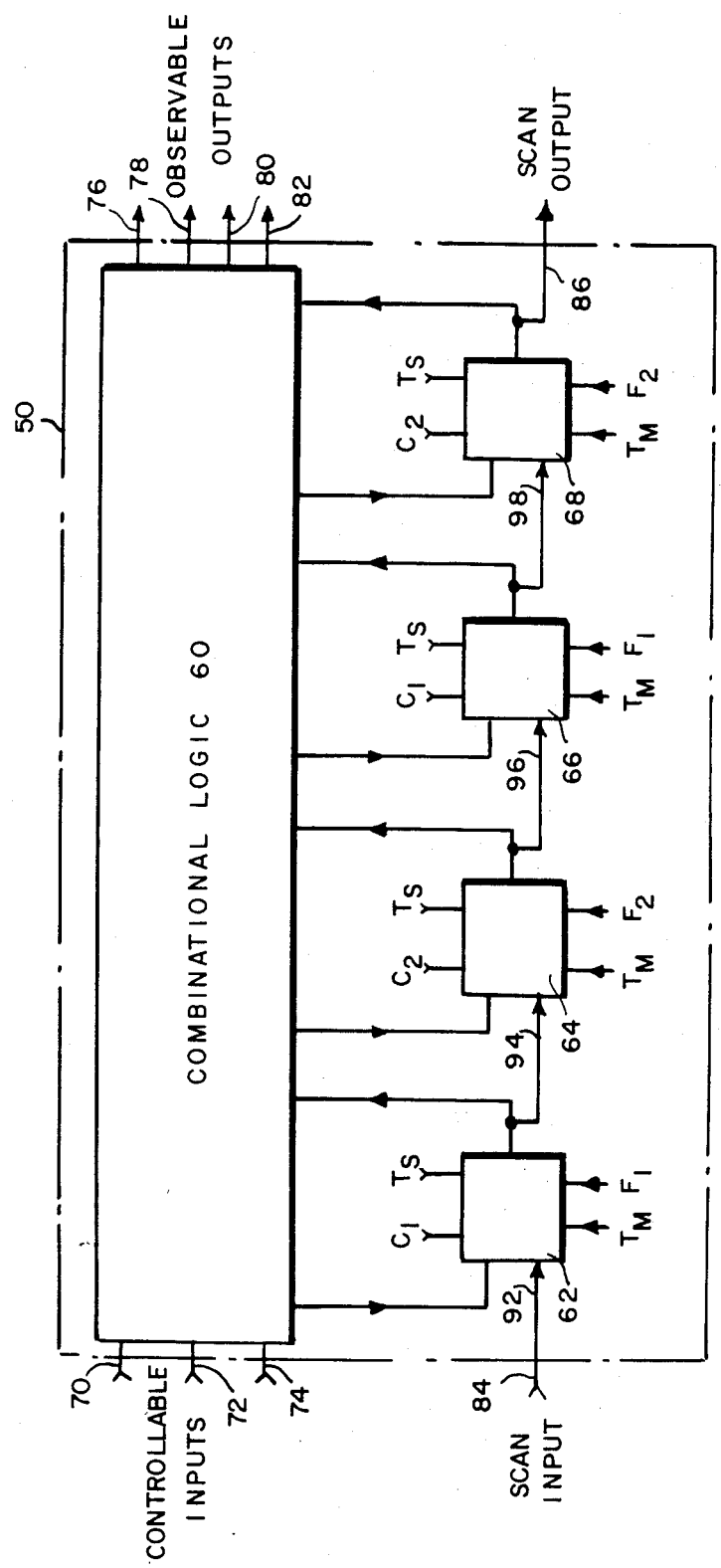
FIG. 2 is block diagram of circuit including combinational logic and scannable flip-flops of the type shown in FIG. 1.

FIG. 2 depicts a diagram of a digital circuit 50 which includes a combinational logic circuit 60 and a plurality of memory elements 62, 64, 66, and 68. There are a selected number of inputs such as 70, 72, and 74 which can be controlled from outside the circuit 50, and a selected number of outputs such as 76, 78, 80, and 82 which can be observed from outside the circuit 50. The memory elements 62, 64, 66, and 68 are scannable flip-flops having the form depicted in FIG. 1. In FIG. 2, the seven connections to each of the boxes representing memory elements 62, 64, 66, and 68 correspond to the similarly positioned seven connections to the dotted box representing the flip-flop 10 in FIG. 1.

The test input nodes 92, 94, 96, and 98 of the memory elements 62, 64, 66, and 68, respectively, are connected so that the memory elements form a shift register. The test input node 92 of memory element 62 serves as an overall input to the shift register and therefore is connected to an externally controllable test input terminal, and the output node of the memory element 68 serves as an overall output and is connected to an externally observable scan output terminal 86.

Figure 3:
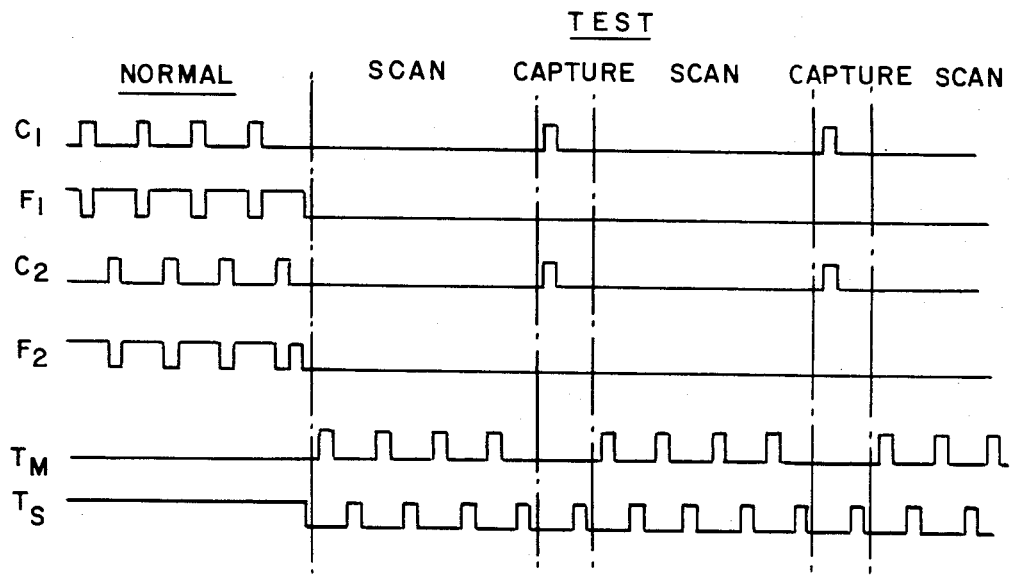
FIG. 3 is a timing diagram useful in illustrating the operation of the circuit depicted in FIG. 2.

FIG. 3 depicts a timing diagram illustrating the clocking of the memory elements 62, 64, 66, and 68 during a normal mode of operation and during a test mode of operation. In FIG. 3, when a signal is high the associated switch is turned on, and when a signal is low the associated switch is turned off.

During the normal mode of operation, the memory elements are operated as static latches and are clocked in two phase-groups: a clock of a first phase comprising signals $C_1$ and $F_1$ clocks memory elements 62 and 66; a clock of a second phase comprising signals $C_2$ and $F_2$ clocks memory elements 64 and 68. Typically, $C_1$ and $C_2$ are non-overlapping clock signals. During the normal mode of operation, the $C_1$ and $F_1$ signals are complementary and the $C_2$ and $F_2$ signals are complementary.

During the test mode the memory elements are operated as dynamic master-slave flip-flops by using the $T_M$ and $T_S$ signals as master and slave clocks, respectively, during a scan operation, and by using $C_1$ and $C_2$ as master clocks and $T_S$ as a slave clock during a capture operation. During the test mode, the signals $F_1$ and $F_2$ are arranged to keep the feedback switches off. Because the memory elements are master-slave flip-flops, all of the memory elements 62, 64, 66, and 68 can be clocked simultaneously. This is contrasted with the normal mode of operation in which the the memory elements in different phase-groups are clocked at different times.

In the scan operation, a test vector is loaded into the memory elements 62, 64, 66, and 68. The signals forming the test vector are sequentially presented to the test input 84 while clocking the memory elements with the signals $T_M$ and $T_S$.

Once the test vector has been loaded into the memory elements 62, 64, 66, and 68, the response of the combinational logic circuit 60 to the test vector is captured, during a capture operation, by clocking the master latches of the memory elements with the signals $C_1$ and $C_2$ and clocking the slave latches of the memory elements with the signal $T_S$. In the normal mode of operation the signals $C_1$ and $C_2$ clock the respective phase-groups at different times, but during the test mode of operation, because the memory elements are operated as master-slave flip-flops, $C_1$ and $C_2$ can clock all of the memory elements simultaneously or at different times. $C_1$ and $C_2$ capture the test response in the master latches of the memory elements; the $T_S$ signal then completes the capture by passing the response to the slave latches.

The response vector is then unloaded serially at the scan output 86 by clocking the memory elements with clock signals $T_M$ and $T_S$. A second test vector may simultaneously be loaded at the scan input node 84. The scan operation and capture operation, as described above, can be repeated to perform additional tests.

It will be appreciated by those skilled in the art that the memory elements of the present invention can be chained in any convenient order, including successively chaining memory elements of the same phase-group. These memory elements also permit the use of single loads of test vectors to test all parts of the combinational logic without the need to separately load test vectors for each of the phase-groups. These advantages are both obtained because memory elements which were originally latches are reconfigured as dynamic master-slave flip-flops during testing.

It is not necessary that all of the memory elements of the digital circuit 50 be scannable. In such a case, the non-scannable memory elements may be treated as part of the logic circuit 60. During a test on such a circuit, it may be desirable to clock the memory elements several times, as though in the normal mode of operation, after loading a test vector and before capturing the response vector.

The scannable flip-flop 10 shown in FIG. 10 can be modified in various ways. For example, if it is not necessary that the latch be static in the normal mode of operation, the switch 18 can be eliminated; in this case the flip-flop 10 would operate as a dyanamic latch in the normal mode of operation and as a dynamic master-slave flip-flop in the test mode.

In order to maximize the speed of the latch, it may be desirable to take the normal output of the flip-flop from the output of the first inverter 12, instead of the second inverter 14; however, the output of the second inverter 14 would still be used to chain to the next memory element in the shift register. This variation requires separate loading of test vectors for each phase-group, but does obtain the advantage that the memory elements may be chained in any order and with fewer added transistors.

The invention has been described in the context of scan testing to facilitate testing from an external tester. The invention is also useful in built-in self-test designs. For example, if a circuit that has a set of input latches, the input latches can be replaced by scannable latches according to the present invention, and, with some additional circuitry (e.g., exclusive OR gates), can be configured into a linear feedback shift register that generates pseudorandom test vectors. Similarly, if a circuit has a set of output latches, they can be replaced by scannable latches according to the present invention and, with some additional circuitry, can be arranged to operate as a signature analyser register to capture signatures of the circuit's test responses.

The foregoing description has been limited to a specific embodiment of this invention. Additional advantages and modifications will be apparent to those skilled in the art. The invention is, therefore, not limited to the specific details, representative apparatus, and illustrative example shown and described in this specification. Rather, it is the object of the appended claims to cover all such variations and modifications as come within the true spirit and scope of the invention.

What is claimed as new and desired to be secured by Letters Patent of the United States is:

1. A memory circuit selectively operable as a static latch, or as a dynamic master-slave flip-flop, comprising:
   (a) a normal input node controlled by a test input switch;
   (b) a test input node controlled by a test input switch;
   (c) first and second inverter elements each having an input and an output, the output of the said second inverter element comprising a circuit output node;
   (d) a forward switch connected between the output of said first inverter element and the input of said second inverter element;
   (e) a feedback switch connected between the output of said second inverter element and the input of said first inverter element; and
   (f) said normal input node and said test input node connected to the input of said first inverter element.

2. The memory circuit of claim 1 further comprising a test output node connected to the output of said second inverter element.

3. A digital memory circuit, for use with a combinational logic unit having a plurality of paired inputs and outputs, comprising:
(A) a plurality of memory elements connected in sequential order, having a first least significant memory element, and a last most significant memory element, each memory element comprising:
   (1) a normal input node for connection to one of the outputs of the combinational logic unit,
   (2) a test input node,
   (3) first and second inverter elements, each having an input and an output, the output of said second inverter element comprising the memory element output node for connection to one of the inputs of the combinational logic unit,
   (4) a forward switch connected between the output of said first inverter element and the input of said second inverter element, (5) a feedback switch connected between the output of said second inverter element and the input of said first inverter element, and (6) said normal input node and said test input node connected to the input of a said first inverter, a normal input switch connected between said normal input node and the input of said first inverter, and a test input switch connected between said normal input node and the input of said first inverter, (B) a test signal connection means connected to the test input node of said first least significant memory element, (C) each test input node of the remaining memory elements is connected to the output of the adjacent less significant memory element, (D) a memory circuit scan output connection means connected to the output node of the said second inverter element of said last most significant memory element, and (E) control means for generating the normal input switch control signal, the test input switch control signal, the forward switch control signal, and the feedback switch control signal such that when operating in the normal mode:

(1) said memory element test input switches are open, (2) said memory element forward switches are closed, (3) said memory element normal input switches control signals clock the memory elements, and (4) said memory element feedback switches control signals are the complement of the normal input switch control signals so that said memory elements function as individual static latches, and such that when operating in the test mode there is a vector load operation, a scan operation, a capture operation and a response vector unload operation, such that when engaging in the vector load operation:

(1) said memory element feedback switches are open, (2) said memory element normal input switches are open, and (3) the test vector is serially loaded, most significant bit first, into the memory circuit, through the test signal connection means, by said memory element test input switches control switches and forward switches being operated as master and slave clocks, so that said memory elements function as dynamic master slave flip-flops connected together to form a shift register, and during the capture operation:

(1) said memory element feedback switches are open, (2) said memory element test input switches are open, and (3) said memory element normal input switch control signal and forward switch control signal of the memory elements operate as master and slave clocks, so that said memory elements function as individual dynamic master slave flip-flops, and during the response vector unload operation:

(1) said memory element feedback switches are open, (2) said memory element normal input switches are open, and (3) the response vector is serially unloaded, most significant bit first, through the memory circuit scan output, the test input control switches and forward switches of said memory elements operate as master and slave clocks so that said memory elements function as dynamic master slave flip-flops connected together to form a shift register, so that a test vector may be loaded into the memory circuit while a resultant vector is unloaded.

4. The digital memory circuit of claim 3 wherein when in operation in the normal mode, the normal input switch and forward switch of adjacent said memory elements are operated at different times.

5. A memory circuit selectively operable as a dynamic latch, or as a dynamic master-slave flip-flop, comprising:

(a) a normal input node controlled by a normal input switch;

(b) a test input node controlled by a test input switch;

(c) first and second inverter elements each having an input and an output and an inherent gate capacitance at the input the output of the said second inverter element comprising a circuit output node;

(d) a forward switch connected between the output of said first inverter element and the input of said second inverter element; and (e) said normal input node and said test input node connected to the input of said first inverter element.

6. The memory circuit of claim 1 further comprising a test output node connected to the output of said second inverter element.

7. A digital memory circuit, for use with a combinational logic unit having a plurality of paired inputs and outputs, comprising:

(A) a plurality of memory elements connected in sequential order having a first least significant, and last most significant memory element, each memory element comprising:

(1) a normal input node for connection to one of the outputs of the combinational logic unit;

(2) a test input node;

(3) first and second inverter elements, each having an input and an output, and an inherent gate capacitance at the input the output of said second inverter element comprising the memory element output node for connection to one of the inputs of the combinational logic unit;

(4) a forward switch connected between the output of said first inverter element and the input of said second inverter element; and (5) said normal input node and said test input node connected to the input of a said first inverter, a normal input switch connected between said normal input node and the input of said first inverter, and a test input switch connected between said normal input node and the input of said first inverter;

(B) a test signal connection means connected to the test input node of said first least significant memory element;

(C) each test input node of the remaining memory elements is connected to the output of the adjacent less significant memory element;

(D) a memory circuit scan output connection means connected to the output node of the said second inverter element of said last most significant memory element; and (E) control means for generating the normal input switch control signal, the test input switch control signal, and the forward switch control signal, such that when operating in the normal mode:

(1) said memory element test input switches are open;

(2) said memory element forward switches are closed; and (3) said memory element normal input switches control signals clock the memory elements, so that said memory elements function as individual dynamic latches;

and such that when operating in the test mode there is a vector load operation, a scan operation, a capture operation and a response vector unload operation, such that when engaging in the vector load operation:

(1) said memory element normal input switches are open; and (2) the test vector is serially loaded, most significant bit first, into the memory element test input switches control switches and forward switches being operated as master and slave clocks, so that said memory elements function as dynamic master slave flip-flops connected together to form a shift register, and during the capture operation:

(1) said memory element test input switches are open; and (2) said memory element normal input switches control signal and forward switch control signal of the memory elements operate as master and slave clocks, so that said memory elements function as individual dynamic master slave flip-flops, and during the response vector unload operation:

(1) said memory element normal input switches are open; and (2) the result vector is serially unloaded, most significant bit first, through the memory circuit scan output, the test input control switches and forward switches of the memory elements operating as master and slave clocks so that said memory elements function as master slave flip-flops connected together to form a shift register, so that a test vector may be loaded into the memory circuit while a resultant vector is unloaded.

8. The digital memory circuit of claim 2 wherein when in operation in the normal mode, the normal input switch and forward switch of adjacent said memory elements are operated at different times.

* * * * *